(12) United States Patent
Schubert et al.

(10) Patent No.: US 7,430,227 B2
(45) Date of Patent: Sep. 30, 2008

(54) WAVELENGTH TUNABLE LASER SOURCE WITH PARAMETER CORRECTION

(75) Inventors: Michael Schubert, Tuebingen (DE); Bernd Nebendahl, Ditzingen (DE); Emmerich Mueller, Aidlingen (DE); Ralf Haeussler, Dresden (DE); Wolf Steffens, Herrenberg (DE)

(73) Assignee: Agilent Technologies, Inc., Santa Clara, CA (US)

( * ) Notice: Subject to any disclaimer, the term of this patent is extended or adjusted under 35 U.S.C. 154(b) by 202 days.

(21) Appl. No.: 10/504,814

(22) PCT Filed: Apr. 30, 2002

(86) PCT No.: PCT/EP02/04736

§ 371 (c)(1),
(2), (4) Date: Jun. 27, 2005

(87) PCT Pub. No.: WO03/094313

PCT Pub. Date: Nov. 13, 2003

(65) Prior Publication Data

US 2005/0232315 A1    Oct. 20, 2005

(51) Int. Cl.
H01S 5/0683 (2006.01)
H01S 5/14 (2006.01)

(52) U.S. Cl. ............................ 372/20; 372/32; 372/102

(58) Field of Classification Search ................... 372/48, 372/20, 32, 102
See application file for complete search history.

(56) References Cited

U.S. PATENT DOCUMENTS

| | | | |
|---|---|---|---|
| 4,897,843 A * | 1/1990 | Scott | 372/20 |
| 5,299,212 A * | 3/1994 | Koch et al. | 372/32 |
| 5,319,668 A | 6/1994 | Luecke | |
| 5,867,512 A | 2/1999 | Sacher | |
| 5,982,794 A * | 11/1999 | Tamura | 372/29.012 |
| 6,144,678 A * | 11/2000 | Hamada | 372/20 |
| 6,324,193 B1 * | 11/2001 | Bourzeix et al. | 372/20 |
| 6,438,147 B1 * | 8/2002 | Roychoudhuri et al. | 372/20 |
| 6,665,321 B1 * | 12/2003 | Sochava et al. | 372/20 |
| 6,778,584 B1 * | 8/2004 | Partlo et al. | 372/99 |
| 6,839,364 B1 * | 1/2005 | Broutin et al. | 372/20 |
| 7,184,451 B2 * | 2/2007 | Ilchenko et al. | 372/20 |

FOREIGN PATENT DOCUMENTS

| | | |
|---|---|---|
| DE | 195 09 922 A1 | 3/1995 |
| DE | 198 32 750 A1 | 7/1998 |
| EP | 0 938 171 A1 | 2/1999 |
| EP | 0951112 | 10/1999 |
| JP | 5-267768 | 10/1993 |

OTHER PUBLICATIONS

Patent Abstracts of Japan, Publication No. 10022585.

* cited by examiner

*Primary Examiner*—Minsun Harvey
*Assistant Examiner*—Michael Carter
(74) *Attorney, Agent, or Firm*—Marc Bobys

(57) ABSTRACT

A wavelength tunable laser unit has a laser mode selection, and is adapted to provide a laser signal in accordance with one or more laser control parameters. For operating the laser unit, the laser signal is swept in a wavelength range, a laser operation signal indicative of the laser unit's operation during the sweep is received, and the laser operation signal is analyzed for detecting an indication of a mode hop occurred in the generated laser signals during the sweep. At least one correction value is determined based on the detected mode hop indication, and at least one of the one or more laser control parameters, applicable for a next wavelength sweep, is modified based on the determined at least one correction value.

20 Claims, 3 Drawing Sheets

WAVELENGTH TUNABLE LASER SOURCE WITH PARAMETER CORRECTION

This application is the National Stage of International Application No. PCT/EP02/04736, International Filing Date, Apr. 30, 2002, which designated the United States of America, and which international application was published under PCT Article 21(2) as WO Publication No. WO 03/094313 A1.

BACKGROUND OF THE INVENTION

The present invention relates to wavelength tunable laser sources.

In the optical communication industry, there is a need for testing optical components and amplifiers with lasers continuously tunable over a wide wavelength range. So-called Littman cavities can be used as external cavities to allow single-mode tuning of the laser, as first described by Liu and Littman in "Novel geometry for single-mode scanning of tunable lasers", Optical Society of America, 1981. The Littman cavity allows tuning wavelength and optical length of the cavity at the same time by changing only one parameter of the geometry, i.e. the tuning element. However, as already pointed out by Liu and Littman in the aforementioned document, mode hops might occur due to deviations of the real geometry with respect to the perfect Littman configuration. Fine adjustment e.g. of the laser end mirror is proposed to avoid mod hops.

Examples of tunable lasers, based on the Littman or other geometries, and various options for reducing or avoiding mode hops can be found e.g. in U.S. Pat. No. 5,867,512, DE-A-19509922, Wenz H. et al: "Continuously Tunable Diode Laser" in 'Laser und Optoelekronik' (Fachverlag GmbH, Stuttgart, D E, Vol. 28 No. 1, p. 58-62, Feb. 1, 1996, XP000775842, ISSN: 0722-9003), Wandt D. et al: "Continuously Tunable External Cavity Diode Laser with a Double-Grating Arrangement" (Optics Letter, Optical Society of America, Washington, US, vol. 22, no. 6, 15 Mar. 1997, pages 390-392, XP000690335, ISSN: 0146-9592), DE-A-19832750, EP-A-938171, JP-A-05 267768, U.S. Pat. No. 5,319,668, or in the co-pending European Patent applications 01121408.7, 01113372.5, or 01113371.7 of the same applicant.

SUMMARY OF THE INVENTION

It is an object of the present invention to improve wavelength tunable lasers. The object is solved by the independent claims. Preferred embodiments are shown by the dependent claims.

According to the present invention, an optical source comprises a laser unit, an analysis unit, and a control unit. The laser unit being tunable in wavelength and having a laser mode selection provides a laser signal representing an output of the optical source. The laser unit is further coupled to the analysis unit. An output of the analysis unit is provided to the control unit, which controls setting of one or more laser control parameters of the laser unit for generating the laser signal.

In operation when the optical source is to provide the laser signal swept through a wavelength range (which can be the full applicable wavelength range of the laser unit or a part of it), the laser unit generates the laser signals according to its predefined laser control parameter(s). The analysis unit receives at least one laser operation signal indicative of the laser unit's operation, and analyses the at least one laser operation signal for one or more indications for mode hops occurred in the generated laser signal during the sweep through the wavelength range. The analysis unit provides such mode hop indications—if available and detected—to the control unit. The control unit uses the mode hop indication(s) for determining at least one correction value for modifying at least one of the one or more laser control parameters of the laser unit in order to modify generation of the laser signal(s) in next wavelength sweep. Preferably, the control parameter modification is provide to reduce or avoid such mode hops associated to the detected mode hop indications. However, as will be seen later, mode hops might even be provoked temporarily in order to eventually reduce or avoid mode hops.

For a next wavelength sweep (which might be the successive and/or a later sweep), either in the same or a different wavelength range, the laser unit will then use the modified one or more laser control parameters (modified by the correction value(s)) for generating the laser signal. It is clear that in case no mode hop indication is found, the control unit will preferably leave the one or more laser control parameters unchanged.

The invention thus provides correction of the one or more laser control parameters in order to reduce or avoid—in a next wavelength sweep—mod hops determined in a previous wavelength sweep. Although the invention thus might not fully avoid mode hop, the invention allows a fast and undisturbed sweep (e.g. not influenced by in-situ corrections) and in particular avoids wavelength and/or phase fluctuations induced by in-situ correction as resulting e.g. from modulation as disclosed in the aforementioned EP-A-938171. The term 'correction' as used herein is therefore to be understood as a modification with the intent to avoid mode hops and might even cover a temporal 'worsening' of the mod hop performance of the generated laser signal caused by modification of the laser control parameter(s) according to the invention. The temporal 'worsening' might even be applied purposely e.g. for stimulating or inducing mode hops as illustrated below.

The laser unit preferably comprises a single-mode laser and/or an external cavity arrangement, wherein mode selection is provided. Such external cavity arrangement might comprise one of the aforementioned Littman configurations or the so-called Litrow configuration as disclosed e.g. in U.S. Pat. No. 5,802,085. However, any other wavelength tunable laser configuration providing laser mode selection is applicable accordingly.

The laser operation signal can be any kind of signal indicative of the laser unit's operation during wavelength sweep allowing to determine indication(s) of mode hop(s) occurring. Such laser operation signal can be, for example, total power of the optical output, ratio of intracavity and output power, the wavelength of the optical output, the power of spontaneous source emission, the power of the side-modes of the laser, the amplitude, phase or frequency noise of the optical output, drive parameters for the laser gain medium (e.g. to maintain constant optical output power) such as electrical current, voltage or power for driving a laser diode.

The analysis unit receives the laser operation signal and detects therefrom mode hop indication(s) indicative for mode hop(s) occurred during the wavelength sweep. If not already available (e.g. since already provided by the laser unit), the analysis unit might derive from the laser operation signal a variation of at least one parameter, preferably such as wavelength, wavelength variation, wavelength variation over wavelength, phase, or power of the laser signal, or laser power, laser diode current, laser diode power. The variation might be a variation over time, a variation over a different laser operation parameter (such as a motor position when tuning by means of motor control).

The analysis unit preferably derives the mode hop indication(s) by analyzing the parameter variation for at least one of discontinuities, jumps, or strong variations (e.g. above predefined limits).

The control unit determines the correction values for the laser control parameters preferably based on theoretical or empirical analysis of the provided mode hop indications. Analyzing the geometry of the laser cavity and calculating the relation(s) of mode hop(s) and necessary corrections can provide a theoretical determination of correction value(s). An empirical determination of correction values can be provided e.g. using historical data from previous runs, values gathered from experience. A hierarchy of parameters might be applied for analyzing the mode hop indications. However, it is clear that the methods and ways for determining the correction values are virtually unlimited and might strongly depend on the specific embodiment of the laser unit.

The determination of correction values for the laser control parameters might be executed e.g. for each wavelength sweep provided by the laser unit, only occasionally for selected wavelengths sweeps or according to a predefined schedule, or during specific calibration runs. The 'self-correction mode' according to the present invention might also be disabled, e.g. by a user, for example in order to avoid changes in the measuring condition during measurements with multiple sequential wavelengths sweeps.

In a preferred embodiment, the laser unit comprises coarse and fine tuning elements. The coarse tuning elements already allow continuously tuning the laser signal, whereby mode hops might occur from deviations between actual and theoretically defined conditions, from tolerances, aging of components, etc. Such coarse tuning elements can be, for example, the aforementioned Littman, Litrow, or any other tunable laser configuration in principle. The fine tuning elements allow correction or modification of the laser arrangement in order to reduce or avoid mode hops. Preferred examples for fine tuning elements are disclosed in the documents mentioned in the introductory part of the description.

The fine tuning element can be provided e.g. for modifying a filter curve for selecting modes. Such variation in the filter curve can be achieved e.g. by one or more of the following: moving a dispersion element for selecting at least one laser mode (e.g. as disclosed in the aforementioned European Patent application 01113371.7), modifying the dispersive characteristic of a dispersive element e.g. by modifying the periodicity of the dispersive element, modifying the direction of the beam incident to the dispersive element, by moving a retro-reflective dispersive element, etc.

Additionally or alternatively, the fine tuning element might comprise elements for modifying the optical path length in the external cavity. This can be provided e.g. by moving one of the cavity elements to change the geometrical length (for example by moving at least one of the end mirrors), moving an optical element such as a wedge substantially perpendicular to the optical beam, controlling the optical path length of at least one of the cavity elements by an external parameter (such as applied electrical or magnetic field, temperature, uniaxial or hydrostatic pressure), controlling the orientation of the optical active axis by an external parameter.

In a preferred embodiment, the analysis unit comprises a wavemeter, preferably as disclosed in EP-A-875743 by the same applicant. Using the wavemeter, the analysis unit measures the wavelength of the laser signal during the wavelength sweep and determines the course/variation of the wavelength $\lambda$ or the wavelength variation ($\Delta\lambda$ or $\Delta\lambda/\lambda$) of the provided laser signals (e.g. over time or over a motor position for tuning the coarse tuning element). The analysis unit analysis the measured course/variation preferably for discontinuities, jumps or strong variations (e.g. over given limits) and interprets those as mode hop indications.

In a preferred embodiment, the control unit can be operated in a testing mode. In that testing mode, the control unit will set arbitrary or pseudo arbitrary correction value(s) for the laser control parameter(s) in order to "induce" or "provoke" mode jumps. Such induced mode hops will then in return allow the control unit to determine actual correction values for the laser control parameters. This in particular useful in case that no mode hop occurred e.g. in a previous run and it thus remains unclear "how good" the current setting for the laser control parameters is.

In a further preferred embodiment, laser activity can be repeatedly disabled during the wavelength sweep (e.g. by switching the laser on and off or reducing the laser power slightly below lasing threshold) in order to avoid mode pulling and thus to receive improved correction values for the laser control parameter. Mode pulling represents the effects that one mode remains lasing although a different mode would be selected (e.g. by a filter curve). This might lead to a hysteresis between two wavelength sweeps in opposite directions (i.e. either increasing or decreasing wavelength values) or, in other words, that mode hops do not occur for same wavelengths during wavelength sweeps with opposite directions.

The invention can be partly embodied or supported by one or more suitable software programs, which can be stored on or otherwise provided by any kind of data carrier, and which might be executed in or by any suitable data processing unit. Software programs or routines are preferably applied for analyzing the laser operation signal, determining the necessary change of the laser control parameters and providing the control parameters during a wavelength sweep.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF PREFERRED EMBODIMENTS OF THE INVENTION

Figure 1:
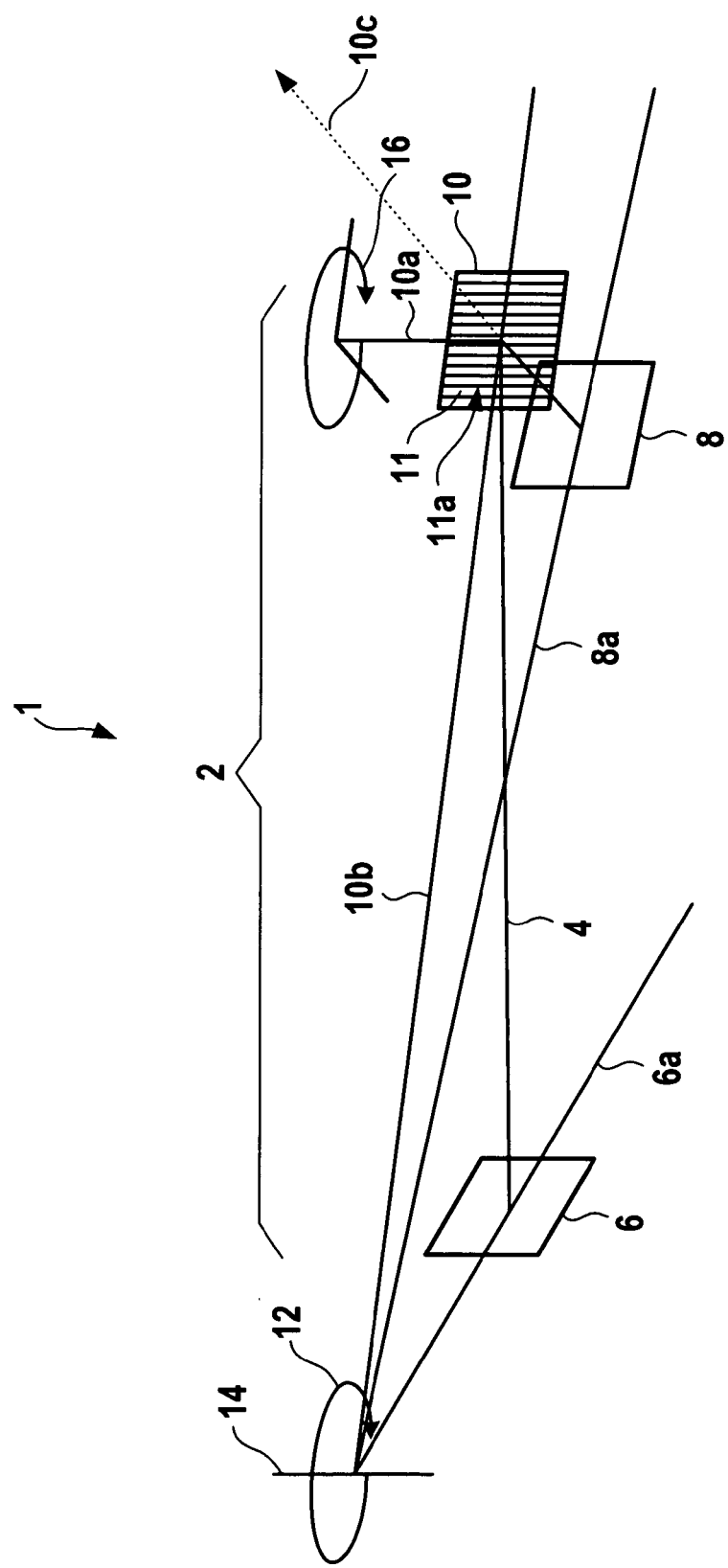
FIG. 1 shows a schematic view of an embodiment of a lasing module 1 for generating a laser signal.

In FIG. 1, the lasing module 1 comprises an external cavity 2 in which laser light provided by an active medium (not shown), e.g. a laser diode, can resonate to provide a laser beam 4. The beam 4 travels in the cavity 2 along a path between a cavity end element 6 and a tuning element 8 of the external cavity 2. The cavity end element 6 and the tuning element 8 both providing a high reflective mirror. The lasing module 1 further comprises a dispersion element 10 introduced in the path of the beam 4 for selecting at least one longitudinal mode of the laser. The dispersion element comprises a grating 11 having rules 11a.

The tuning element 8 can be rotated by an actuator (not shown) according to arrow 12 about a pivot axis 14 to tune the laser. The pivot axis 14 is theoretically defined by the intersection of the surface plane (indicated by line 6a) of the cavity end element 6, the surface plane (indicated by line 10b) of the dispersion element 10 and the surface plane (indicated by line 8a) of the tuning element 8.

The dispersion element 10 can be moved corresponding (preferably simultaneously) with the rotation of the tuning element 8 to compensate a shift between the real position of the pivot axis 14 and the theoretically defined position. This can be done by moving the dispersion element 10 along such a predetermined path that the compensation is sufficient to provide continuous single-mode tuning within a predetermined tuning range of the tuning element 8. The dispersion element 10 can be moved by rotating as indicated as arrow 16 by a predetermined rotation angle about the rotating axis 10a which is substantially parallel to the rules 11a and substantially lies in the plane of the grating 11.

Compensating shift between the real position of the pivot axis 14 and the theoretically defined position can be achieved—in addition or alternatively—e.g. by moving the grating 11 linearly along an axis 10c which is perpendicular to the grating 11 and lies in the plane of the axis 10b and 8a, or other adequate measures.

Figure 2:
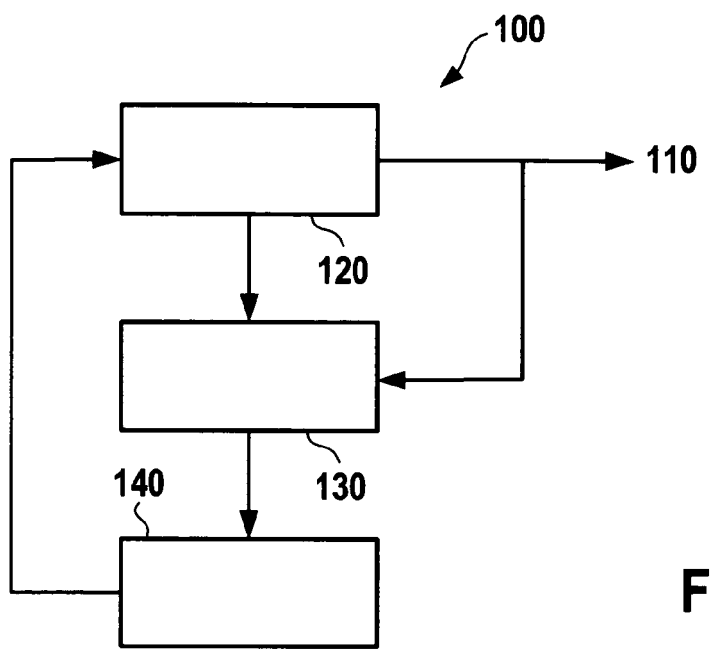
FIG. 2 shows a principle embodiment of an optical source 100 according to the present invention.

In FIG. 2, the optical source 100 comprises a laser unit 120, an analysis unit 130, and a control unit 140. The laser unit 120 preferably comprises the lasing module 1 for generating a laser signal 110 representing an output of the optical source 100. However, any other tunable lasing device might be applied accordingly. The laser unit 120 is further coupled to the analysis unit to receive a laser operation signal indicative of the laser unit's operation, which can be e.g. the laser signal 110 or another operation parameter. An output of the analysis unit 130 is provided to the control unit 140, which controls setting of at least one laser control parameter of the laser unit 120 for generating the laser signal 110.

For sweeping the laser signals 110 through a wavelength range (e.g. from λs to λe), the laser unit 120 generates the laser signals 110 according to its predefined laser control parameters. The analysis unit 130 analyzes the received laser operation signal for one or more indications for mode hops occurred in the generated laser signal during the sweep, and provides such mode hop indications—if available—to the control unit 140. The control unit 140 uses the mode hop indications for determining at least one correction value for modifying at least one of the laser control parameters in order to avoid such mode hops associated with the detected mode hop indications. For a next wavelength sweep, either in the same or a different wavelength range, the laser unit 120 will then use the modified laser control parameters (modified by the correction value(s)) for generating the laser signal λ. In case no mode hop indication is found, the control unit 140 will leave the laser control parameters unchanged.

Figure 3A:
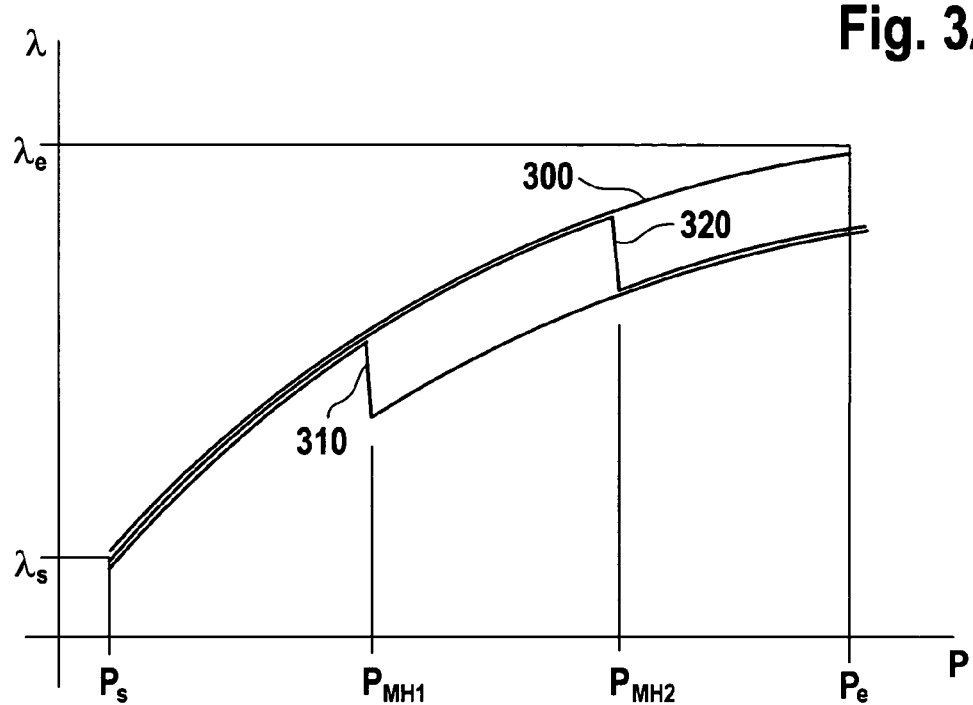

FIG. 3A illustrates an example of the laser signal 110 swept through the wavelength range from λs to λe for the embodiment of a laser unit comprising the lasing module 1 of FIG. 1. The x-axis shows the positions $P_s$ through $P_e$ of a coarse tuning element rotating the tuning element 8 according to arrow 12 about the pivot axis 14 to tune the laser, and the y-axis denotes the λ values as measured by the analysis unit 130 from the laser signal 110. Curve 300 shows an example of a sweep with no mode hops occurring. Curve 310 shows an example of a sweep wherein a mode hop occurs at a position $P_{MH1}$.

The analysis unit 130 analyses curve 310, detects the wavelength jump at the position $P_{MH1}$, interprets that wavelength jump as a mode hop indication at the position $P_{MH1}$, and provides that information to the control unit 140.

Figure 3B:
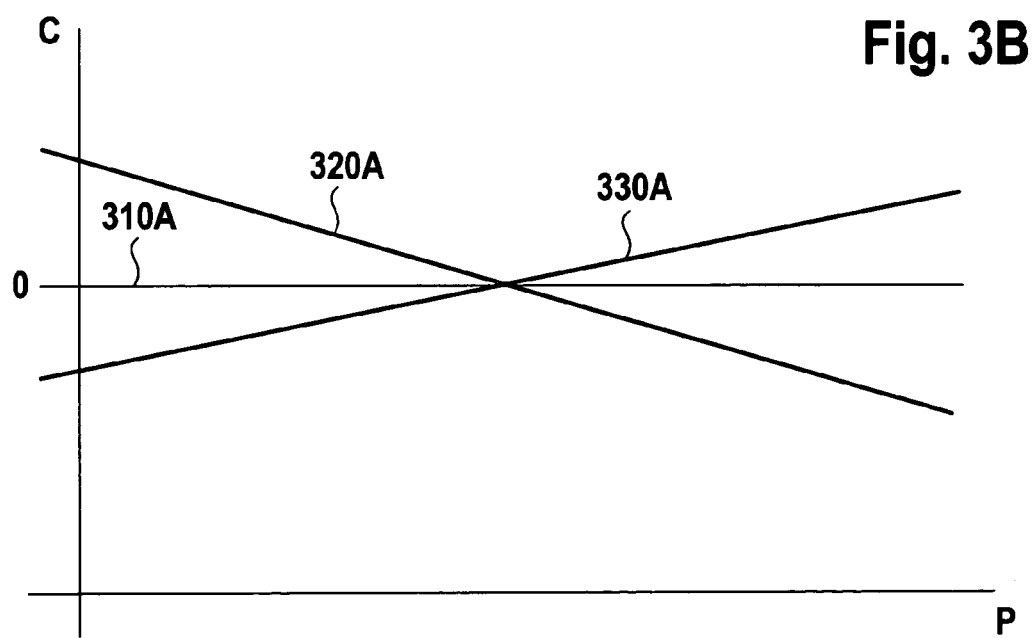

FIG. 3B shows examples for correction curves of correction values C. In the specific example herein, the correction values C are applied for a fine tuning element rotating the dispersion element 10. However, it is clear that the correction can be applied accordingly for other elements and/or in other locations of the cavity e.g. for compensating shift of the pivot axis 14. Preferred examples for correction might be adjusting any of the axes, lines or planes shown in FIG. 1, modifying the effective optical path length of the cavity (e.g. by modifying the refractive index in at least a part of the cavity, or by translating elements—as preferably the tuning element 8), or any other known way as disclosed above or in the documents mentioned in the introductory part of the description.

Curve 310A corresponds to curve 310, or in other words, in this example no correction is done during the sweep of curve 310. With the information of the one mode hop indication at the position $P_{MH1}$ of the coarse tuning element, the control unit 140 changes the correction curve to curve 320A.

Geometrical analysis for the cavity structure of FIG. 1 show that rotating the dispersion element 10 around a certain angle will produce a single mode hop in a known direction.

To compensate for the single mode hop occurred in the curve 310, the dispersion element 10 might therefore be rotated approximately around this angle during the wavelength sweep. An exact value can usually not be determined unless it is known, at which position P a second mode hop will occur. Because of that, the slope for correction can be deduced more easily, if more that one mode hop occur. In case of one single mode hop, a first try can be a slope smaller than the one that would be needed for compensating exactly one mode hop in the tuning range. The result of this new correction curve 320A can be seen as exemplary curve 320 taken from a next wavelength sweep.

The analysis unit 130 again analyses curve 320, detects a wavelength jump at the position $P_{MH2}$, and signals a mode hop indication at the position $P_{MH2}$ to the control unit 140. With the information of the one mode hop indication at the position $P_{MH2}$ together with the information about the distance between the two mode hops occurred at the positions $P_{MH1}$ and $P_{MH2}$, the control unit 140 now changes the correction curve to curve 330A, which in this example here eventually results in the mode hop free curve 300 taken in a next wavelength sweep.

Figure 4:
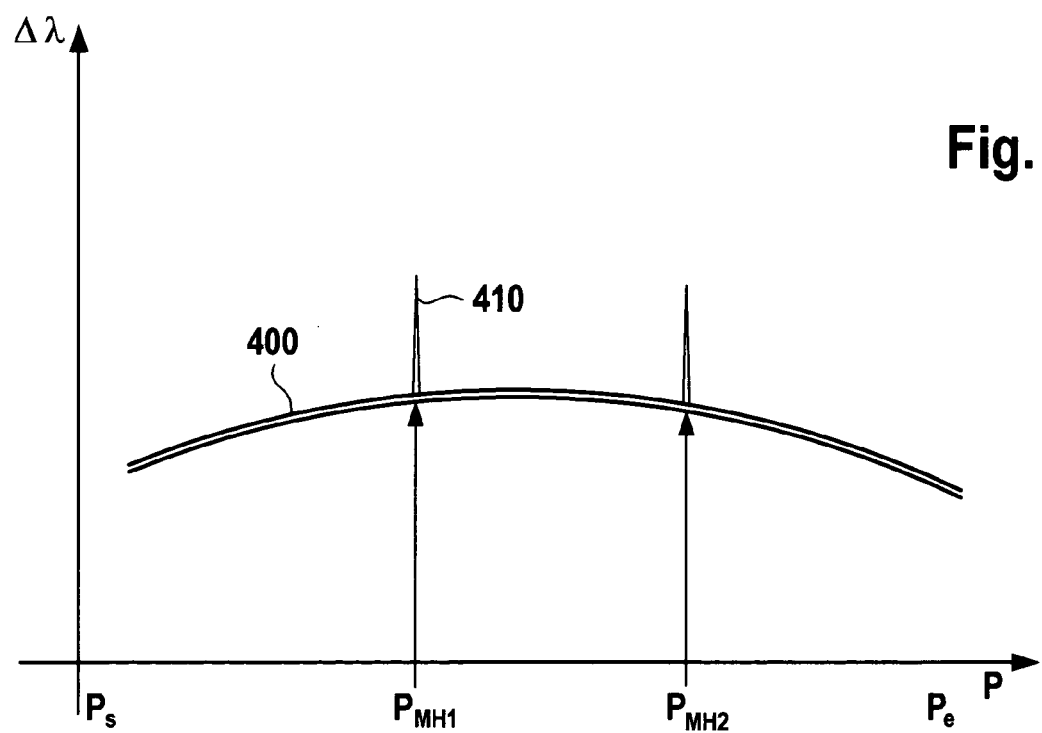
FIGS. 3A, 3B, 4 illustrate examples for correcting a laser signal according to the present invention.

FIG. 4 illustrates another example of the laser signal 110 swept through the wavelength range. The x-axis again shows the actuator positions $P_s$ through $P_e$, and the y-axis denotes the wavelength difference Δλ as measured and determined by the analysis unit 130 from the laser signal 110. Curve 400 shows an example of a sweep with no mode hops occurring. Curve 410 shows an example of a sweep wherein two mode hops occur at positions $P_{MH1}$ and $P_{MH2}$. The analysis unit 130 analyses curve 410, detects two peaks (over given thresholds) at the positions $P_{MH1}$ and $P_{MH2}$, interprets them as mode hop indications, and provides that information to the control unit 140. With the information about the two mode hop indications at the positions $P_{MH1}$ and $P_{MH2}$ in combination with information about their distance to each other and/or the respective peak directions, the control unit 140 changes the correction curve (e.g. from curve 310A) to curve 330A (see FIG. 3B), which will then result in the mode hop free curve 400 taken in a next wavelength sweep.

Since the actual curves strongly depend on the specific actual implementation, the curves in FIGS. 3 and 4 only show schematic representations for the sake of better illustration. It is clear that actual wavelength curves according to FIGS. 3A and 4 can be substantially different and might significantly differ from the smooth curves of FIGS. 3A and 4. Further, the correction curves of FIG. 3B need not be linear type curves but might follow higher order curves, might have discontinuities, and/or might be derived empirically (and might not follow any 'meaningful' mathematical description or formula).

The invention claimed is:

1. An optical source comprising:
   a continuously tunable laser unit, continuously tunable over a range of wavelengths, having a laser mode selection, and providing a laser signal in accordance with one or more laser control parameters,
   an analysis unit coupled to the laser unit, receiving a laser operation signal indicative of the laser unit's operation, and
   a control unit receiving an output of the analysis unit and controlling a setting of the one or more laser control parameters of the laser unit for generating the laser signal,
   wherein the analysis unit analyzes the laser operation signal for an indication of a mode hop occurring in the generated laser signals during a continuous sweep through a wavelength range, and provides the detected mode hop indication to the control unit, and
   the control unit determines at least one correction value based on the detected mode hop indication for modifying at least one of the one or more laser control parameters for a next wavelength sweep.

2. The optical source of claim 1, wherein the laser unit comprises at least one of a single-mode laser and an external cavity arrangement.

3. The optical source of claim 1, wherein the laser operation signal is at least one of: total power of the laser signal, ratio of intracavity and output power of the laser signal, wavelength of the laser signal, power of spontaneous source emission of the laser signal, power of side-modes of the laser signal, amplitude, phase or frequency noise of the laser signal, a drive parameter for a laser gain medium, or electrical current, voltage or power for driving a laser diode.

4. The optical source of claim 1, wherein the analysis unit derives a variation of at least one parameter from the laser operation signal.

5. The optical source of claim 4, wherein the parameter is at least one of wavelength, wavelength variation, wavelength variation over wavelength, phase, power of the laser signal, laser power, laser diode current, laser diode power.

6. The optical source of claim 4, wherein the variation is at least one of a variation over time or a variation over a different laser operation parameter.

7. The optical source of claim 4, wherein the analysis unit derives the mode hop indication by analyzing the parameter variation for at least one of a discontinuity, a jump, a strong variations, or a variation above a predefined limit.

8. The optical source of claim 1, wherein the control unit determines the at least one correction value based on at least one of a theoretical or an empirical analysis.

9. The optical source of claim 8, wherein the theoretical analysis is based on at least one of an analysis of the geometry of the laser cavity and a calculation of the relationships of plural mode hops.

10. The optical source of claim 8, wherein the empirical analysis is based on at least one of historical data from previous runs, values gathered from experience, and a hierarchy of parameters.

11. The optical source of claim 1, wherein the laser unit comprises coarse tuning elements adapted for substantially continuously tuning the laser signal, and a fine tuning element adapted to provide a correction or modification of the coarse tuning elements.

12. The optical source of claim 10, wherein the fine tuning element at least one of: modifies a filter curve for selecting modes, moves a dispersion element for selecting at least one laser mode, modifies the dispersive characteristic of a dispersive element, modifies the periodicity of the dispersive element, modifies the direction of the beam incident to the dispersive element, moves a retro-reflective dispersive element, modifies the optical path length in the external cavity, moves one of the cavity elements to change the geometrical length, moves at least one of the end mirrors, moves an optical element such as a wedge substantially perpendicular to the optical beam, controls the optical path length of at least one of the cavity elements by an external parameter, controls the orientation of the optical active axis by an external parameter.

13. The optical source of claim 12, wherein the external parameter is at least one of an applied electrical or magnetic field, temperature, uniaxial or hydrostatic pressure.

14. A method for operating a continuously tunable laser unit continuously tunable over a range of wavelengths, having a laser mode selection, and being adapted to provide a laser signal in accordance with one or more laser control parameters, the method comprising the steps of:
   (a) sweeping the laser signal over a continuous range of wavelengths,
   (b) receiving a laser operation signal indicative of the laser unit's operation during the sweep,
   (c) analyzing the laser operation signal for detecting an indication of a mode hop occurring in the generated laser signals during the sweep,
   (d) determining at least one correction value based on the detected mode hop indication, and
   (e) modifying, based on the determined at least one correction value, at least one of the one or more laser control parameters applicable for a next continuous wavelength sweep.

15. The method of claim 14, wherein the steps (b) to (e) are executed on at least one of: each wavelength sweep, selected wavelengths sweeps, according to a predefined schedule, during specific calibration runs.

16. The method of claim 14, wherein execution of the steps (b) to (e) can be disabled.

17. The method of claim 14, further comprising a step prior to step (a) of setting at least one arbitrary or pseudo arbitrary correction value for at least one of the one or more laser control parameters in order to induce or provoke a mode hop.

18. The method of claim 14, wherein the step (a) comprises a step of repeatedly disabling or reducing laser activity during the wavelength sweep.

19. A software program or product, stored on a data carrier, for executing the method of claim 14, when run on a data processing system.

20. An optical source comprising:
   a continuously tunable laser unit continuously tunable over a range of wavelengths, having a laser mode selection, and providing a laser signal in accordance with a position of a coarse laser tuning element,
   an analysis unit measuring during a first continuous wavelength sweep through a wavelength range, a wavelength or a variation of the wavelength of the laser signal over a position of the coarse laser tuning element, detecting at least one mode hop occurring in the generated laser signal, and
   a control unit determining a correction curve depending on the position of the detected mode hop, and applying during a second continuous wavelength sweep the correction curve to a fine tuning element, so that mode hops during the second continuous sweep are reduced or avoided.

* * * * *